United States Patent [19]

Ray

[11] 4,081,744
[45] Mar. 28, 1978

[54] RESISTANCE BRIDGE TRANSDUCER CONDITIONING CIRCUIT

[75] Inventor: David J. Ray, Albuquerque, N. Mex.

[73] Assignee: The United States of America as represented by the Secretary of the Air Force, Washington, D.C.

[21] Appl. No.: 740,516

[22] Filed: Nov. 10, 1976

[51] Int. Cl.² ............................................. G01R 27/02
[52] U.S. Cl. .................................... 324/63; 323/75 N; 324/62; 324/130
[58] Field of Search .......................... 324/63, 62, 130; 323/75 N, 75 B

[56] References Cited

U.S. PATENT DOCUMENTS

| 3,203,223 | 8/1965 | Petrow | 324/130 X |
| 3,209,248 | 9/1965 | Siefert | 324/63 |
| 3,319,155 | 5/1967 | Kooiman et al. | 324/63 X |
| 3,450,978 | 6/1969 | Norman | 324/63 X |
| 3,501,696 | 3/1970 | Riley | 324/130 X |
| 3,568,044 | 3/1971 | Elazar | 323/75 N |
| 3,667,041 | 5/1972 | Senour | 324/130 |
| 3,783,692 | 1/1974 | Hansen | 323/75 N X |

Primary Examiner—Stanley T. Krawczewicz
Attorney, Agent, or Firm—Joseph E. Rusz; Willard R. Matthews, Jr.

[57] ABSTRACT

A conditioning circuit for a resistance bridge transducer that includes output signal amplification, a voltage regulated DC power source for transducer excitation and a calibration select circuit for selectively inserting a shunt calibration resistor into parallel with one bridge arm. The calibration select circuit comprises a field effect transistor switch that is connected in series with the calibration resistor between two adjacent transducer terminals. The field effect transistor switch is operated by the output of an operational amplifier in response to positive and negative DC control signals. The conditioning circuit is adaptable to miniaturization through the use of integrated and hybrid circuits.

2 Claims, 2 Drawing Figures

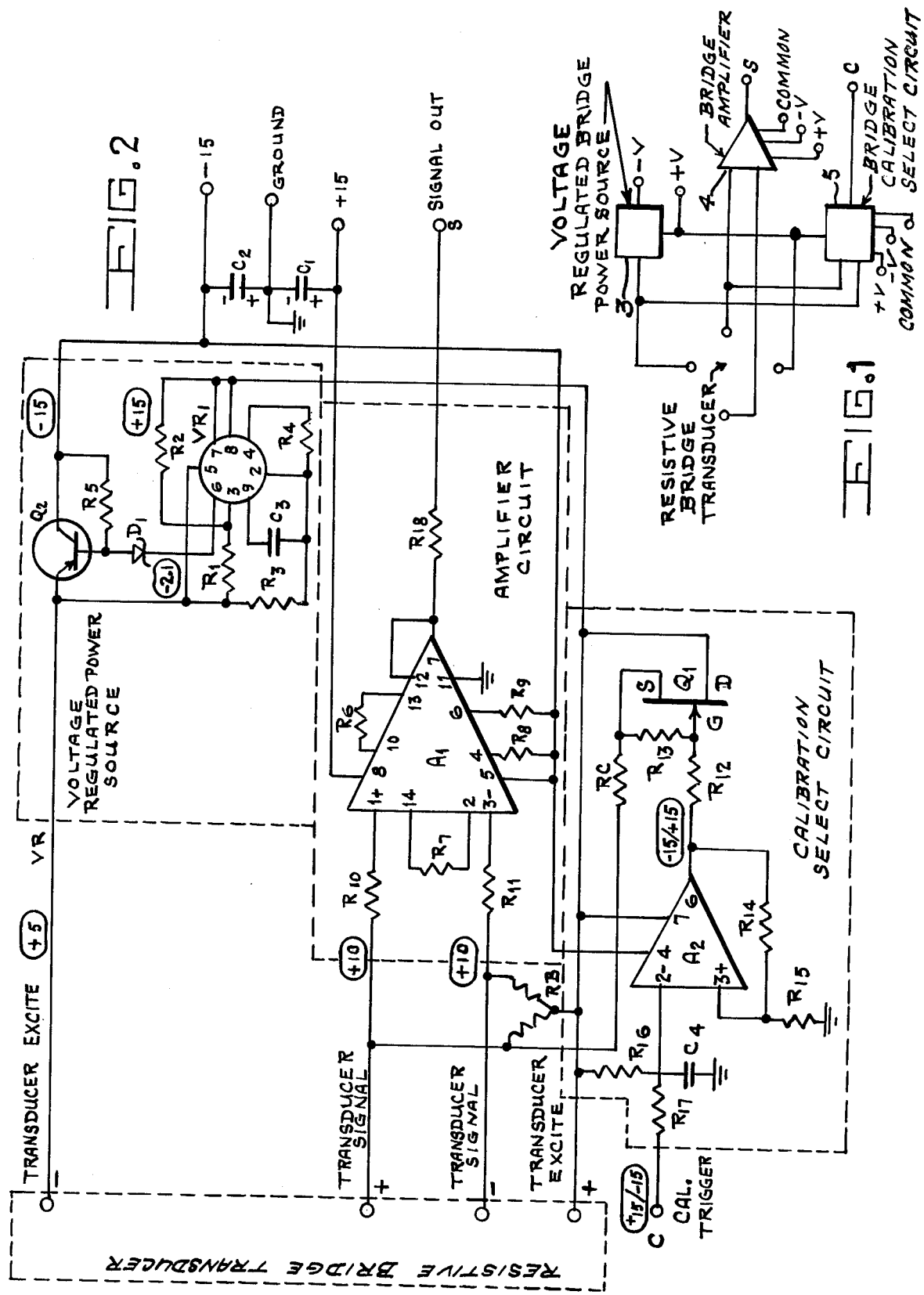

RESISTANCE BRIDGE TRANSDUCER CONDITIONING CIRCUIT

STATEMENT OF GOVERNMENT INTEREST

The invention described herein may be manufactured and used by or for the Government for governmental purposes without the payment of any royalty thereon.

BACKGROUND OF THE INVENTION

This invention relates to resistance bridge transducers, and in particular to conditioning circuits having means for calibrating of such devices.

Many transducers use a complete or partial Wheatstone bridge whose elements change resistance with the parameter (acceleration, pressure, structure strain, stress, etc.) being measured. The voltage change is normally small and must be amplified. The bridge must also be powered by a direct current. In many instances it is desirable for the bridge to have a known resistance inserted shuntwise with one arm to produce a calibration signal.

Improved operation of the system can be achieved if an analysis of the entire data collection system is provided by observing the system output calibration signal. Further advantage results from placing the signal conditioner close to the transducer thereby improving the signal to noise ratio of the resulting signal.

Present resistive bridge transducer signal conditioners however are too large to be conveniently placed at or in proximity to the transducer. Furthermore, conventional calibration circuits do not provide for analysis of the entire data collection system.

The present invention is directed toward overcoming these state-of-the-art circuit deficiencies by reducing the size and complexity of the conditioners and by providing a new and improved calibration circuit.

SUMMARY OF THE INVENTION

The invention comprises a resistance bridge transducer circuit for use with variable resistance transducer elements in a Wheatstone bridge arrangement. The circuit provides constant direct current voltage to drive the circuit, amplification of the bridge output signal, and shunt calibration for the bridge. The shunt calibration portion of the circuit includes a calibration resistor in series with a field effect transistor switch and an operational amplifier with positive feedback that is used to control the operation of the transistor switch. Integrated and hybrid circuits are used to achieve miniaturization of the circuit.

It is a principal object of the invention to provide a new and improved resistance bridge transducer conditioning circuit.

It is another object of the invention to provide a conditioning circuit for a resistive bridge transducer that is simpler and smaller than state-of-the-art circuits of that type.

It is another object of the invention to provide a resistance bridge conditioning circuit having improved calibration means.

These, together with other objects, features and advantages of the invention, will become more readily apparent from the following detailed description when taken in conjunction with the illustrative embodiment in the accompanying drawings.

DESCRIPTION OF THE DRAWINGS

FIG. 1 is a block diagram of one presently preferred embodiment of the invention; and FIG. 2 is a schematic diagram of the embodiment of the invention illustrated in FIG. 1.

DETAILED DESCRIPTION OF THE PREFERRED EMBODIMENT

The conditioning circuit of the invention is illustrated in block diagram form in FIG. 1. The circuit may be divided into three basic functions: amplification, bridge power supply, and bridge calibration. These functions are realized by the circuits designated as bridge amplifier 4, voltage regulated bridge power source 3, and bridge calibration select circuit 5 in FIG. 1. These circuits are disclosed in detail by the schematic diagram of FIG. 2. Referring now to FIG. 2, the amplifier circuit comprises amplifier A1, and resistors $R_6$, $R_7$, $R_8$, $R_9$, $R_{10}$, $R_{11}$ and $R_{18}$. The voltage regulated bridge power source comprises voltage regulator VR1, transistor $Q_2$, Zener diode $D_1$, resistors $R_1$, $R_2$, $R_3$, $R_4$ and $R_5$, and capacitor $C_3$. The bridge calibration select circuit comprises operational amplifier $A_2$, field effect transistor $Q_1$, calibration resistor RC, resistors $R_{12}$, $R_{13}$, $R_{14}$, $R_{15}$, $R_{16}$ and $R_{17}$, and capacitor $C_4$.

The amplifier circuit is shown with gain determining resistors $R_6$ and $R_7$. The gain A is $A = (R_6/R_7)$. Resistors $R_8$ and $R_9$ are used to reduce any DC offset in the amplifier $A_1$. The resistive bridge transducer dash outlined is not part of the invention but is shown for reference. Resistors $R_{10}$ and $R_{11}$ are used to protect the amplifier $A_1$ from damage by excessive current. The value of these resistors may be anything from zero (for no protection) to some maximum value which permits at least the minimum bias current input to $A_1$ (for maximum protection). Resistor $R_{18}$ is used to prevent excessive current from being drawn from $A_1$ in case the output signal line S is connected to some low impedance.

The regulated voltage from the voltage regulated power source is labeled VR and is applied to the transducer. The regulator shown uses a Fairchild Semiconductor integrated circuit voltage regulator uA723. However, any other negative regulator circuit is acceptable provided it can supply enough current to the transducer and produces the proper regulated voltage. Having a reference to the circuitry for shunt calibration of one arm of the transducer RC is the resistor shunted into parallel with the transducer by transistor $Q_1$ which is an N channel field effect transistor. $Q_1$ is turned off and on by the output of $A_2$ which is an operation amplifier with positive feedback. The output of $A_2$ is normally $-15$ volts. When line C is connected to $-15$ volts, the output of $A_2$ goes to $+15$ volts and transistor $Q_1$ is turned on. RC is now in parallel with one arm of the transducer bridge. Resistors $R_{14}$, $R_{15}$, $R_{16}$ and $R_{17}$ determine the input level on line C which will change the output of $A_2$ from $-15$ volts to $+15$ volts. Capacitor $C_4$ and Resistor $R_{17}$ prevent amplifier $A_2$ from changing its output voltage in the presence of short duration noise pulses on line C. Resistors $R_{12}$ and $R_{13}$ are typically very large and isolate Q1 from $A_2$ while providing the proper bias levels for $Q_1$. Resistor RB may be placed in either of two positions and is used to balance the transducer output.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. A signal conditioning circuit for a resistance bridge transducer comprising
   a voltage regulated power supply connected to supply DC power to the excitation terminals of said bridge transducer,
   amplifier means connected to the signal output terminals of said bridge transducer,
   a bridge calibration resistor, and
   a calibration select circuit for selectively connecting said calibration resistor into and out of parallel relationship with one arm of said resistance bridge transducer said calibration select circuit comprising a field effect transistor connected in series with said calibration resistor between two adjacent resistance bridge tranducer terminals, and an operational amplifier connected to turn said field effect transistor on and off in response to positive and negative DC control signals.

2. A signal conditioning circuit for a resistance bridge transducer as defined in claim 1 wherein said calibration select circuit comprises
   said field effect transistor, the source electrode thereof being connected through said calibration resistor to one resistance bridge transducer terminal and the drain electrode thereof being connected to an adjacent resistance bridge transducer terminal,
   said operational amplifier having first and second inputs and an output,
   first, second, third, fourth, fifth and sixth resistors,
   a capacitor, and
   a calibration select circuit actuating trigger, the output of said operational amplifier being connected through said first resistor to the gate electrode of said field effect transistor, said second resistor being connected between the gate electrode and the source electrode of said field effect transistor, said third resistor being connected between the output and the first input of said operational amplifier, said fourth resistor being connected between the first input of said operational amplifier and ground, said fifth resistor being connected between the second input of said operational amplifier and said actuating trigger, said sixth resistor being connected between the second input of said operational amplifier and one resistance bridge transducer excitation terminal, said capacitor being connected between said second input of said operational amplifier and ground, and said actuating trigger being switchable between positive and negative power supply source terminals.

* * * * *